US009705010B2

(12) United States Patent
Pang et al.

(10) Patent No.: US 9,705,010 B2
(45) Date of Patent: Jul. 11, 2017

(54) SCHOTTKY DIODE HAVING FLOATING GUARD RINGS

(71) Applicant: Magnachip Semiconductor, Ltd., Cheongju-si (KR)

(72) Inventors: Yon Sup Pang, Cheonan-si (KR); Hyun Chul Kim, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 15 days.

(21) Appl. No.: 14/968,071

(22) Filed: Dec. 14, 2015

(65) Prior Publication Data
US 2016/0343881 A1  Nov. 24, 2016

(30) Foreign Application Priority Data
May 22, 2015 (KR) .................. 10-2015-0072155

(51) Int. Cl.
*H01L 29/872* (2006.01)
*H01L 29/06* (2006.01)
*H01L 21/762* (2006.01)

(52) U.S. Cl.
CPC ........ *H01L 29/872* (2013.01); *H01L 29/0619* (2013.01); *H01L 29/0649* (2013.01); *H01L 21/762* (2013.01); *H01L 29/0692* (2013.01)

(58) Field of Classification Search
CPC ............... H01L 29/872; H01L 29/0619; H01L 29/0649; H01L 29/0692; H01L 21/762
See application file for complete search history.

(56) References Cited

U.S. PATENT DOCUMENTS

| | | | |
|---|---|---|---|
| 2002/0024056 A1* | 2/2002 | Miyakoshi | H01L 29/0619 257/144 |
| 2006/0180892 A1* | 8/2006 | Pardoen | H01L 29/0619 257/484 |
| 2011/0233713 A1 | 9/2011 | Son | |
| 2013/0037851 A1* | 2/2013 | Gejo | H01L 29/0634 257/139 |
| 2014/0077261 A1* | 3/2014 | Oshino | H01L 29/404 257/140 |
| 2014/0374791 A1* | 12/2014 | Matsudai | H01L 29/404 257/139 |

* cited by examiner

*Primary Examiner* — Mark Tornow
(74) *Attorney, Agent, or Firm* — NSIP Law

(57) ABSTRACT

The present examples relate to a Schottky diode having floating guard rings and an additional element isolation layer configured to further improve a breakdown voltage of the Schottky diode, while maintaining the turn-on voltage and current in the forward characteristic, compared to a related Schottky diode. The floating guard rings in the examples are located in a position between the anode and the cathode regions or under the anode.

20 Claims, 23 Drawing Sheets
(4 of 23 Drawing Sheet(s) Filed in Color)

SCHOTTKY DIODE HAVING FLOATING GUARD RINGS

CROSS-REFERENCE TO RELATED APPLICATION(S)

This application claims the benefit under 35 USC 119(a) of Korean Patent Application No. 10-2015-0072155 filed on May 22, 2015 in the Korean Intellectual Property Office, the entire disclosure of which is incorporated herein by reference for all purposes.

BACKGROUND

1. Field

The following description relates to a Schottky diode having a single floating region or multiple floating regions. The following description also relates to a Schottky diode configured to increase a breakdown voltage (BV) compared to that of a an alternative Schottky diode through use of a single floating guard ring or multiple floating guard rings and an additional element isolation layer or shallow trench isolation (STI) located between the floating guard ring or rings and a cathode region for the Schottky diode.

2. Description of Related Art

A Schottky diode is typically used to good effect as a switching or a rectifying device in a semiconductor circuits. A Schottky diode, as discussed herein is a diode that is formed as a combination of a semiconductor portion and a metal portion. A metal anode enables the Schottky diode to have higher switching performance than a general alternative PN junction diode.

This result of higher switching performance occurs because when a forward bias voltage is applied to the Schottky diode, a Minority Carrier Injection (MCI) does not occur, by contrast with the alternative PN junction diode. That is, the Schottky diode has an advantage as a component of having a very short recovery time because current flows by using majority carriers, not minority carriers. Thus, there is no storage effect. Moreover, the turn-on voltage of a Schottky diode is lower than that of comparable PN junction diodes.

By contrast, the breakdown voltage of conventional Schottky diodes is not high for many integrated circuit applications. In particular, in some applications, a Schottky diode has been integrated into a Bipolar-Complementary Double Diffused Metal Oxide Semiconductor (CDMOS)-Double Diffused Metal Oxide Semiconductor (DMOS) (BCD) process that is an example technology of an integrated circuit. However, a Schottky diode with a higher breakdown voltage than a Schottky diode of an alternative art is potentially desirable. However, introduction of a simple guard ring or a shallow trench isolation (STI) into the Schottky diode does not improve its breakdown voltage for BCD technology.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a Schottky diode having a floating guard ring includes a deep well of a first conductivity type formed in a substrate, a first guard ring of a second conductivity type in a non-floating state formed to surround a center region of the deep well, a second guard ring of a second conductivity type in a floating state formed in an outer region of the first guard ring to surround the first guard ring, a first well region of a first conductivity type formed in an outer region of the first guard ring to surround the second guard ring, element isolation layers formed on the region between the first guard ring and the second guard ring, and the region between the second guard ring and first well region, an anode electrode formed on the substrate and electrically connected to the deep well and the first guard ring, a cathode electrode formed on the substrate and electrically connected to the first well region, and an additional element isolation layer formed between the second guard ring and the cathode electrode.

The first and second guard rings may be formed to be deeper than the element isolation layers.

The first and second guard rings may be formed to contact parts of the deep well and the bottom sides of the element isolation layers.

The first and second guard rings, may, respectively, include a first doping region and a second doping region, and the first and second doping regions may have different impurity concentrations.

The first doping region may have a high dopant concentration, and the second doping region may have a low dopant concentration.

Depths of the first and second guard rings may be the same.

The anode electrode may include anode electrodes that are connected to form the anode electrode, and the Schottky diode may further include a third guard ring of a second conductivity type, in a floating state, formed between the anode electrodes.

The anode electrode may include anode electrodes that are connected to form the anode electrode, the Schottky diode may further include a third guard ring of a second conductivity type formed between the anode electrodes, and the anode electrode may not be formed on the upper side of the third guard ring.

In another general example, a Schottky diode having a floating guard ring includes an anode electrode and a cathode electrode formed on a substrate, a first PN junction that is electrically connected to the anode electrode, a first well region that is electrically connected to the cathode electrode through a well and a heavily doped region, the well and the heavily doped region having the same type of dopant, a second PN junction that is formed between the anode electrode and the cathode electrode, and a first element isolation layer that is formed between the first PN junction and second PN junction, wherein the first PN junction and second PN junction are formed to be in contact with a bottom side of the first element isolation layer, and the second PN junction is an electrically floating region.

The lengths of overlap of the first PN junction and second PN junction with the first element isolation layer may be different.

The second PN junction may have an impurity concentration of 1E16 to 1E20 $cm^{-3}$.

The first PN junction may have substantially the same depth as the second PN junction.

A breakdown voltage of the Schottky diode may be 38 to 50V or higher.

In another general aspect, a Schottky diode having a floating guard ring includes a first guard ring in a non-floating state formed to surround a center region of a deep well formed in a substrate, a second guard ring in a floating state formed in an outer region of the first guard ring to surround the first guard ring, a first well region formed in an outer region of the first guard ring to surround the second guard ring, element isolation layers formed on the region between the first guard ring and the second guard ring, and the region between the second guard ring and first well region, an anode electrode formed on the substrate and electrically connected with the deep well and the first guard ring; and a cathode electrode configured on the substrate and electrically connected to the first well region.

The Schottky diode having a floating guard ring may further include an additional element isolation layer formed between the second guard ring and the cathode electrode.

The deep well and the first well region may be of a first conductivity type and the first guard ring and the second guard ring may be of a second conductivity type.

The first and second guard rings may be formed to be deeper than the element isolation layers.

The first and second guard rings may be formed to contact parts of the deep well and the bottom sides of the element isolation layers.

The first and second guard rings, respectively, may include a first doping region and a second doping region, and the first and second doping regions may have different impurity concentrations.

Depths of the first and second guard rings may be the same.

Other features and aspects will be apparent from the following detailed description, the drawings, and the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The information presented in certain drawings is only clearly observable if the drawings are in color, and hence the drawings are presented in color in order to render this information visible, as a black and white or grayscale drawings would not fully communicate this information.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
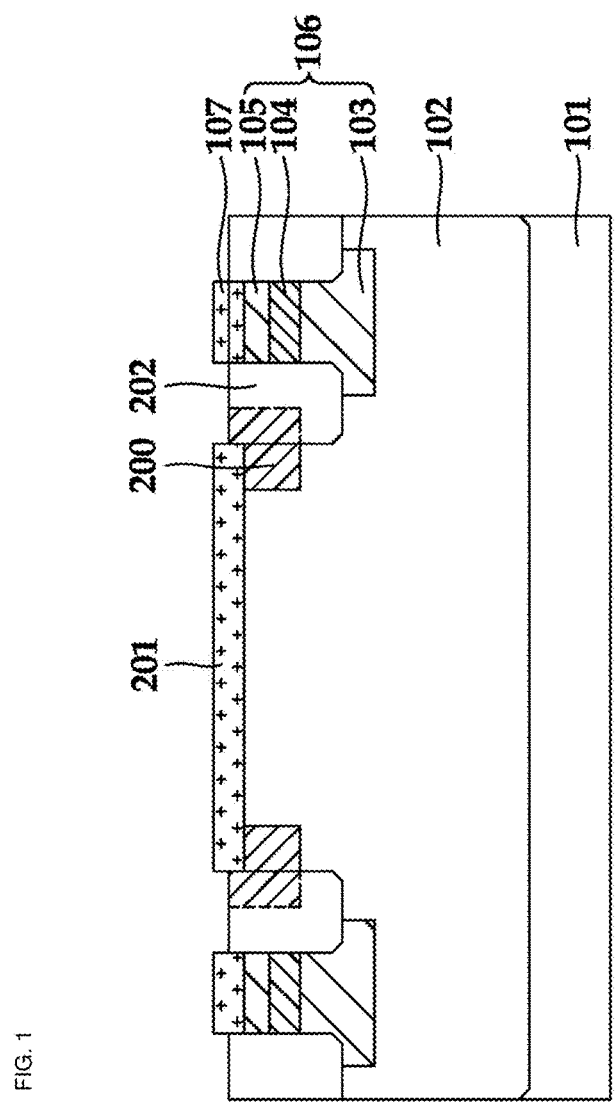
FIG. 1 is a cross-sectional view illustrating a Schottky diode according to a structure of an alternative example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Certain examples are now described in further detail with reference to the accompanying drawings.

In the following description, the same drawing reference numerals are used for the same elements, even in different drawings. The matters defined in the description, such as detailed constructions of terms and elements, are provided to assist in a comprehensive understanding of the present examples. Accordingly, it is apparent that it is possible for the examples to be carried out without those specifically defined matters. Also, well-known functions or constructions are not described in detail to avoid obscuring the examples with unnecessary detail.

While the expressions such as "first" or "second" are potentially used to refer to various elements, the elements are not intended to be limited by the expressions. Such expressions are used only for the purpose of distinguishing one element from the other when referring to such elements.

The expressions presented are used herein only for the purpose of explaining specific examples and are not intended to place limits on the present examples. An expression in singular form also encompasses plural meaning, unless otherwise specified. Throughout the description, the expression "comprise" or "have" is used only to designate the existence of a characteristic, number, step, operation, element, component or a combination thereof which is described herein, but not to preclude possibility of existence of one or more of the other characteristics, numbers, steps, operations, elements, components or combinations of these or other appropriate additions.

Spatial words, such as below, beneath, lower, above and upper are used to conveniently recite a correlation between one element or features and other elements or features, as illustrated in the drawings. When spatial terminology is used with a direction as illustrated in the drawing, if the illustrated element is upside down, the element that was recited as below and beneath is also potentially considered to be above or upper of another element. Thus, examples presented below include all such instances related to the directions of below and above. An element is also potentially aligned in another direction, and thereby spatial words are interpreted according to the alignment.

Moreover, words such as a first conductivity type and a second conductivity type indicate opposite conductivity types like P-type or N-type. An example that is each recited and illustrated herein includes complementary examples thereof, in which P-type dopants are replaced by N-type dopants and vice versa. For example, in an example, a first conductivity type is a N-type and a second conductivity type is a P-type, but these types are switched in another example.

Hereinafter, an example is illustrated referring to the attached drawings.

FIG. 1 is a cross-sectional view illustrating a Schottky diode of an alternative art.

Referring to the example of FIG. 1, a Schottky diode includes an N-type deep well, or deep NW, 102 located in a P-type substrate 101, an element isolation layer 202 located in the substrate 101 with a ring shape, a P-type guard ring 200 located on the deep well 102 adjacent to an inner sidewall of the element isolation layer 202, an N-type well 106 located on the deep well 102 adjacent to an outer sidewall of the element isolation wall 202, an anode electrode 201 located on the substrate 101 and connected to the deep well 102 and the guard ring 200 and, a cathode electrode 107 located on the substrate 101 and connected to the well 106. For example, a part of the guard ring 200 is located in the element isolation layer 202.

The aforementioned approach has an effect of improving a forward electrical characteristic of a Schottky diode having the guard ring by preventing an increase of a current route between the anode electrode and the cathode electrode, because a depth of the guard ring is smaller than the depth of the element isolation layer with respect to the upper substrate and a depth of the well is greater than the depth of the element isolation layer. In particular, a well 106 region has an effect of improving a forward characteristic of a Schottky diode by using a first impurity region 105, a second impurity region 104 and a third impurity region 103 to reduce the resistance of the cathode region.

However, a Schottky diode suggested to implement this technical approach has a low breakdown voltage of BV=22 V and thus, there are limitations in realistic device applications, especially in BCD technology applications, due to issues that arise from this breakdown voltage.

Figure 2A:
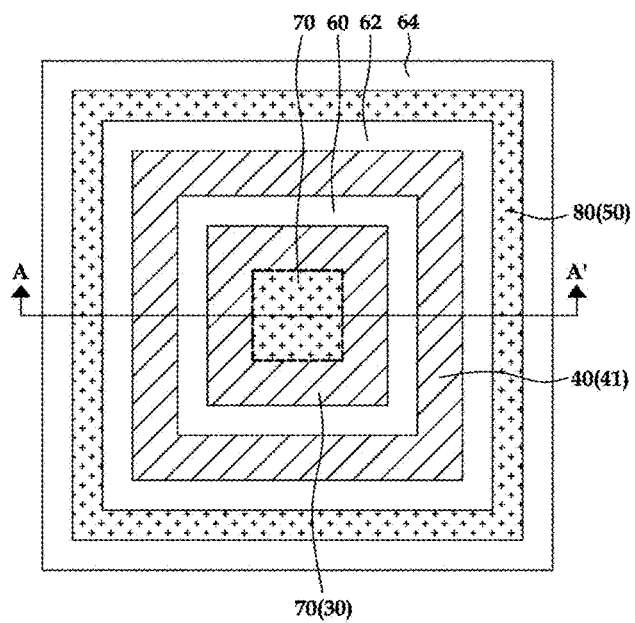
FIG. 2A is a top view illustrating a Schottky diode having a floating guard ring according to an example.
Figure 2B:
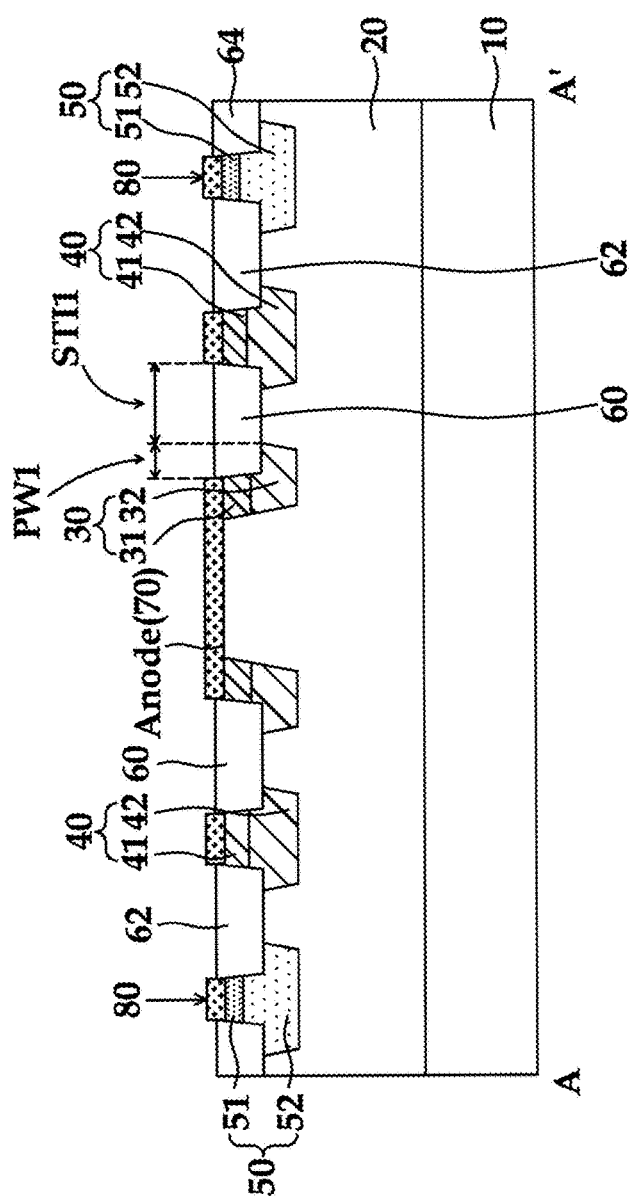
FIG. 2B is an A-A' cross-sectional view of FIG. 2A illustrating a Schottky diode having a floating guard ring and additional STI according to an example.

FIG. 2A is a top view illustrating a Schottky diode having a floating guard ring and an additional STI 64, illustrated in FIG. 2B, according to an example.

In the example of FIG. 2A, the anode electrode 70 is formed in a rectangular shape in the example of FIG. 2A. However, in alternative examples, the anode electrode 70 formed in a circle, oval, lozenge or polygonal shape.

Thus, in the example of FIG. 2B, the anode electrode 70 and the first guard ring 30 overlap the element isolation layer 60.

A P-type first guard ring 30 is electrically connected to the anode electrode 70 and formed to surround the anode electrode 70, or a center region of a deep well. In this example, the first guard ring 30 is formed with a predetermined depth with respect to the upper side of the substrate 10. The depth and the doping concentration of the first guard ring 30 are determined by the energy and dopant dose of the implantation of the first guard ring 30.

FIG. 2A illustrates an example in which the first guard ring 30 is formed under a part of the anode electrode 70, having a rectangular shape. However, this example is merely a form of one feature that is selected to easily explain a technical feature of the present description. That is, the first guard ring 30 is potentially formed in a variety of appropriate forms, such that it surrounds the center region of deep well 20. For example, the first guard ring 30 is, as an alternative, formed in a circular shape, or in other alternatives the corners are formed in a circular or rectangular shape, and so on.

FIG. 2B is an A-A' cross-sectional view of FIG. 2A illustrating a Schottky diode having a floating guard ring according to an example.

As illustrated in the example, FIG. 2B, a Schottky diode having a floating guard ring according to an example includes an N-type deep well 20 formed in a substrate 10; a P-type first guard ring 30 formed to surround a central region of the deep well 20; a P-type second guard ring 40 formed in an outer region of the first guard ring 30 to surround the first guard ring 30; an N-type first well region 50 formed in an outer region of the second guard ring 40 to surround the second guard ring 40; a first element isolation layer 60 formed in the region between first guard ring 30 and the second guard ring 40; a second element isolation layer 62 formed at the region between the second guard ring 40 and the well region 50; an anode electrode 70 formed on the substrate 10 and electrically connected with the deep well 20 and the first guard ring 30; a cathode electrode 80 formed on the substrate 10 and electrically connected to the well region 50, and the second guard ring 40 is in a floating state. In this example, the depths of the first and the second guard rings are the same.

In this example, the P-type first guard ring 30 is also referred to as a first PN junction 30. Furthermore, the P-type second guard ring 40 is also referred to as a second PN junction 40. Thus, it is possible to describe this example in the following manner. The Schottky diode has a floating guard ring, including an anode electrode 70 and a cathode electrode 80 formed on a substrate. The Schottky diode also includes the first PN junction 30 that is electrically connected with the anode electrode 70, a first well region 50 that is electrically connected with the cathode electrode 80, the second PN junction 40 that is located between the anode electrode 70 and the cathode electrode 80, the first element isolation layer 60 located between the first PN junction 30 and the second PN junction 40; the second element isolation layer 62 that is located between the second PN junction 40 and the first well region 50, the first PN junction and the second PN junction formed to contact the bottom side of the first element isolation layer 60, and the second PN junction 40 is an electrically floating region. Additionally, in this example, the depths of the first and the second PN junctions are the same.

Further, as illustrated in the example of FIG. 2B, the first guard ring 30, the second guard ring 40 and the well region 50 are configured to have a greater depth than the element isolation layer 60.

In this example, the first guard ring 30 is formed to overlap a part of the element isolation layer 60 and thereby, the first guard ring 30 is formed to be in contact with a side and a part of the bottom side of the element isolation layer 60.

A region in a floating state of the Schottky diode according to an example is formed such that its electrode is not electrically connected with the anode electrode 70, the cathode electrode 80, or the ground. The P-type second guard ring 40 is completely surrounded by an N-type deep well region 20. Accordingly, the N-type deep well 20 and the P-type second guard ring 40 form the second PN junction. The first guard ring and the N-type deep well form the N-type deep well and the first PN junction, likewise. Two PN junctions are further preferable for increasing a breakdown voltage than one PN junction. When there is only the first PN junction in a reverse bias state, a heavy load is applied to the first guard ring region. However, when the second PN junction is added, the load of the first guard ring is reduced. A depletion region is formed in a reverse bias state by the PN junction; and thereby the depletion region increases due to the presence and configuration of the first PN and the second PN. Accordingly, most of the voltage drop is induced across the depletion region. The PN junctions, including the floating PN junction relieve the local intensification of electric fields, and as a result the Schottky diode of the present examples has a higher breakdown voltage than the alternative Schottky diode in the example of FIG. 1.

In this example, it is possible to increase the breakdown voltage further by increasing the number of the second conductivity type guard rings that are present in a floating state. The example of FIG. 2B illustrates the presence of one second conductivity type guard ring in a floating state. However multiple second guard rings in a floating state are potentially arranged between the first guard ring and the well region with the first conductivity type 50.

Potential contours in a floating region are influenced by an anode voltage and a cathode voltage. A potential change of the floating guard region 40 is smaller than that of a grounded guard region. Accordingly, the floating guard region 40 increases the breakdown voltage of the Schottky barrier diode (SBD).

Further, referring to the example of FIG. 2B, the doping regions with a P+ high concentration 31 and 41 of the first and the second guard rings 30 and 40, and the doping region with an N+ high concentration 51 of the well region 50 are formed to have a smaller depth than the element isolation layer 60.

Various semiconductor substrates are used as the substrate 10, such as a silicon substrate. For example, the substrate doped with a P-type impurity is used as the substrate. In an example, the impurity concentration of the substrate 10 is 5E15 cm$^{-3}$. The N-type deep well 20 is formed on the aforementioned substrate 10. Herein, in an example, the impurity concentration of the N-type deep well 20 is 1E16-1E17 cm$^{-3}$.

Referring to FIG. 2B, the anode electrode 70 is formed on the central region of the deep well 20, and is thereby electrically connected to the deep well 20 and the first guard ring 30 that are illustrated subsequently. More particularly, the anode electrode 70 is formed on the upper side of the central region of the deep well 20. A metal silicide layer is used for the anode electrode 70. In examples, the anode electrode includes at least one material selected from cobalt silicide and titanium silicide.

The first guard ring 30 is divided into a first doping region and a second doping region. In this example, the concentrations of the first and the second doping regions differ. The first doping region 31 has a P+ high concentration, and is positioned to be adjacent to the upper side of the substrate. The second doping region 32 has a low concentration and is formed to surround the lower side of the doping region 31 with the P+ high concentration. In this example, the doping concentration of the region 31 is higher than that of the P-type well 32. The first region 31 with the P+ doping concentration is part of a rectifying metal silicide-P-type semiconductor junction. The first guard ring 30 prevents the local intensification of electric fields around the element isolation layer 60. In consequence, the first guard ring 30 improves the breakdown voltage for the reverse characteristic of the Schottky diode.

Referring to the example of FIG. 2B, the doping region 31 with a P+ high concentration of the first guard ring 30 is formed in a P-type well 32 of the first guard ring 30. That is, the doping region 31 with a P+ high concentration of the first guard ring 30 is configured to overlap the P-type well 32 of the first guard ring 30.

The P-type second guard ring 40 is formed in an outer region of the first guard ring 30 to surround the first guard ring 30 and the element isolation layer 60. The second guard ring 40 is also possibly formed to have a rectangular shape like the first guard ring 30 or to have a circular, oval, lozenge or polygonal shape, or another appropriate shape in other examples.

Further, the second guard ring 40 is potentially divided into the first and the second doping regions, in a manner similar to that for the first guard ring 30. Concentrations of the first and second doping regions are different. The first doping region 41 has a P+ high doping concentration. The second doping region 42 has a P− low doping concentration and potentially includes the P-type well 42 formed to surround the bottom side of the first doping region 41. Herein, the doping concentration of the first doping region 41 is greater than that of the P-type well region 42. Also, only the second doping region and not the first doping region are potentially formed in the second guard ring 40.

Furthermore, a P+ high concentration doping region 41 of the second guard ring 40 is formed in a P-type well 42. Also, a silicide material is formed or not formed on the second guard ring 40. The second guard ring 40 is in a floating state, and thus is potentially formed on a silicide material. That is, a silicide on a floating guard ring does not affect the electrical characteristics of a Schottky diode.

The N-type well region 50 is configured in an outer region of the second guard ring 40 so as to surround the second guard ring 40 and the element isolation layer 62. In this example, the well region 50 is configured to have a rectangular, a circular, oval, lozenge or polygonal shape, or another appropriate shape, according to the shape of first guard ring 30 or the second guard ring 40 as illustrated in the example of FIG. 2A.

The cathode electrode 80 is formed on the upper side of the well region 50. That is, the cathode electrode 80 is formed on the substrate 10 so as to electrically contact the well region 50. Herein, in such an example, the cathode electrode 80 comprises at least one material that is selected from cobalt silicide, titanium silicide and aluminum.

For example, the well region 50 includes the doping region 51 with an N+ high concentration, that is electrically connected to the cathode electrode 80, and an N-type well 52 configured to surround the lower side of the doping region 51. In this example, the impurity concentration of the doping region 51 is greater than the impurity concentration of the doping region 52, which is itself greater than that of the deep well 20. That is, the concentration of the N+ doping region 51>the concentration of the N-type well 52>the concentration of the N-type deep well 20 in terms of the impurity concentration level.

The first element isolation layer 60 is formed at the region between the first guard ring 30 and the second guard ring 40. The second element isolation layer 62 is formed at the region between the second guard ring 40 and the well region 50. In an example, the element isolation layers 60 and 62 are formed through a Shallow Trench Isolation (STI) or LOCOS process. Preferably, the first element isolation layer 60 is formed with a rectangular shape like the first guard ring 30, the second guard ring 40 and the well region 50.

The first guard ring 30, the second guard ring 40, and the well region 50 are physically isolated from one another by the element isolation layers 60 and 62.

In this example, the second guard ring 40 is in a floating state. In such an example, the floating state indicates an electrically open state.

The floating guard ring 40 in a region between the anode electrode 70 and the cathode electrode 80 of the Schottky diode in FIG. 2B leads to a higher breakdown voltage than that of an alternative art. Furthermore, the Schottky diode having the floating guard ring has a breakdown voltage that higher than 30V, offering this improved characteristics.

Figure 2C:
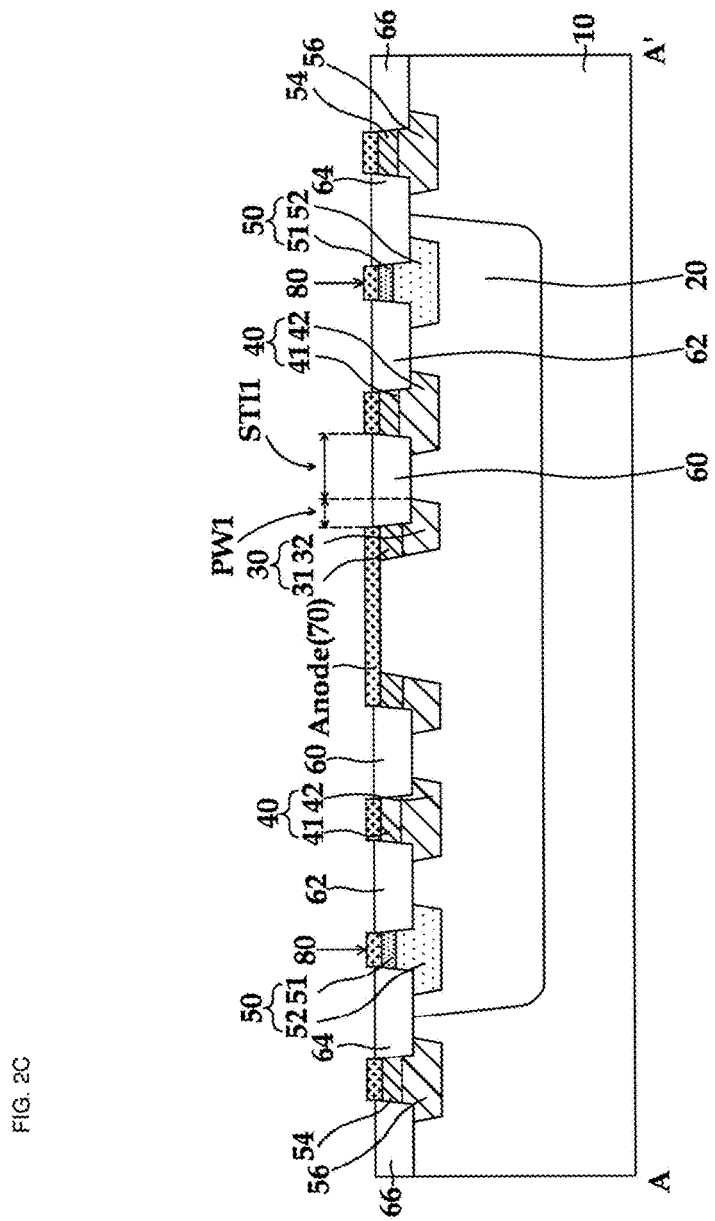
FIG. 2C is an A-A' cross-sectional view of FIG. 2A illustrating a Schottky diode having a floating guard ring and additional STI according to another example.

Additionally, FIG. 2C illustrates the presence of a third element isolation layer 64, formed between the cathode electrode 80 and a P-type well tap 54. The third element isolation layer 64 is necessary to isolate the cathode 80 from the P-type well tap 54 and wherein the well tap 54 is enclosed by a P-type well region 56. Both the P-type well tap 54 and P-type well region 56 are formed in the P-type substrate 10. The fourth element isolation layer 66 adjacent to the well tap 54 is provided to isolate another device (not shown) formed in the substrate 10. The deep N-type well region 20 is surrounded by the P-type substrate 10.

Figure 3A:
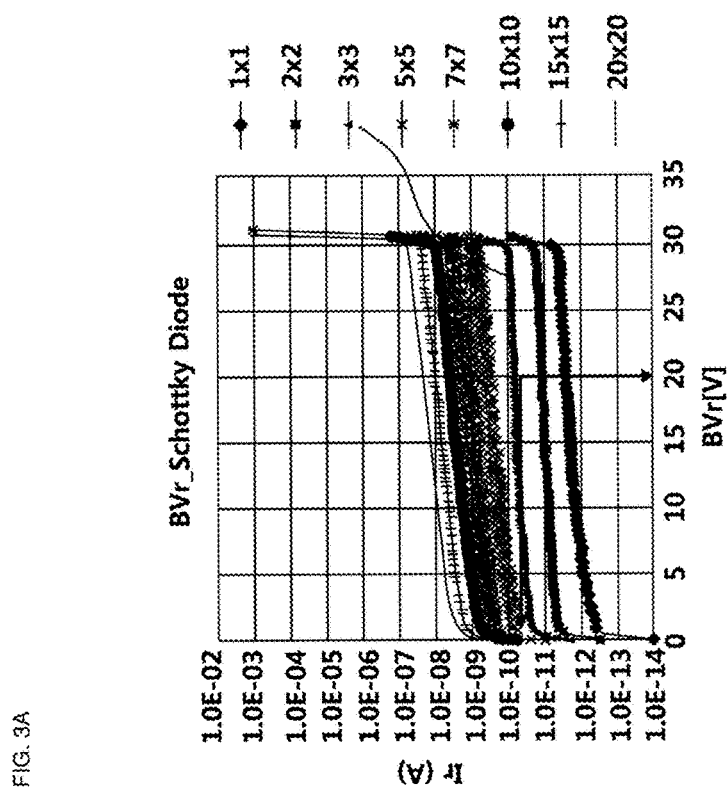
FIG. 3A and FIG. 3B are graphs showing the electrical characteristics of the Schottky diode structure having a first guard ring in a non-floating state and a second guard ring in a floating state of the present examples.
Figure 3B:
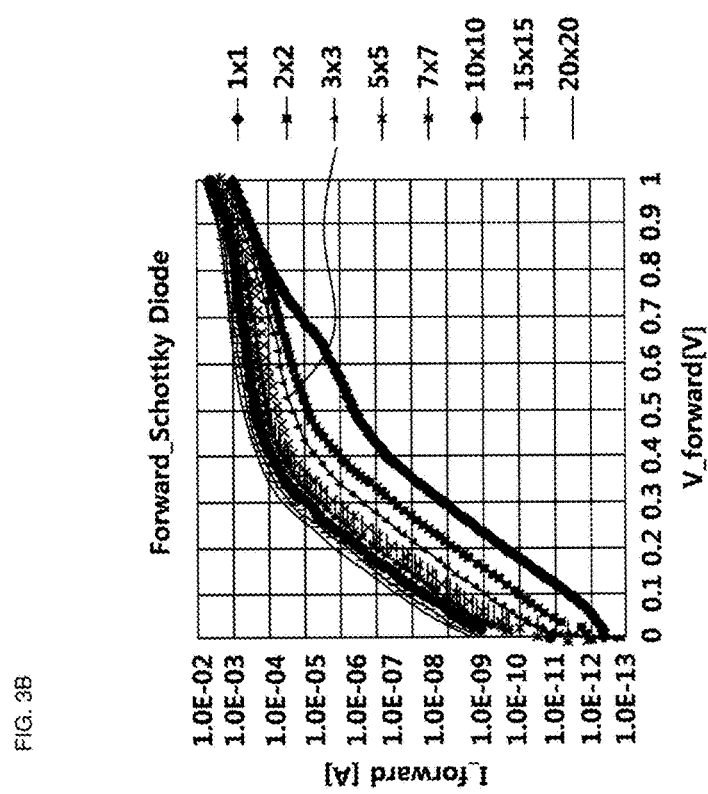

FIG. 3A and FIG. 3B are performance evaluation results regarding a Schottky diode structure having first guard ring in a non-floating state and a second guard ring in a floating state according to the present examples. In FIGS. 3A-3B, the graphs correspond to Schottky diodes with dimensions in μm, such as 1 μm*1 μm, 2 μm*2 μm, and so on.

FIG. 3A shows the reverse electrical characteristics of the Schottky diode in FIG. 2B with respect to the parameter of the Schottky diode area for STI1=1.38 μm where STI1 or X is the separation distance between the first guard ring 30 and the second guard ring 40. In this example, STI1 excludes the overlap of the first guard ring 30 with the element isolation layer 60. FIG. 3A illustrates the anode current of the reverse-biased Schottky diode. As the anode voltage is swept from 0 V, the anode leakage current and the electric field at the depletion region in the Schottky diode increase. As the electric field becomes greater than the critical field, a large quantity of electron-hole pairs is generated, due to the impact ionization process at the depletion region. Thus, the anode current rapidly increases at the avalanche breakdown voltage $V_A=-30$ V. In this example, the breakdown voltage is almost independent of the Schottky diode area. With reference to the leakage current of the area 3*3 μm², the value of the leakage current 26.7 E-12 A/μm at the reverse bias voltage $V_A=-20$ V is very low for most IC applications. The guard rings 20 and 40 have certain physical roles for improvement of the breakdown voltage. For example, the guard ring 20 improves the breakdown voltage by preventing strong electric fields at the edge of STI. The guard ring 40 also improves the breakdown voltage by extending the depletion region and preventing a local intensification of electric fields.

FIG. 3B shows the forward electrical characteristic of the Schottky diode in FIG. 2B, with the parameter of the Schottky diode area for STI1=1.38 μm. In examples, the forward diode current increases as area increases. Referring to the measurement result of 3*3 μm², the anode current is $I_A=3$ μA/μm at $V_A=0.4$ V, which meets a device target. The first and the second guard rings 30 and 40 also contribute to the improvement of the breakdown voltage, but they do not degrade the forward anode current.

Figure 4A:
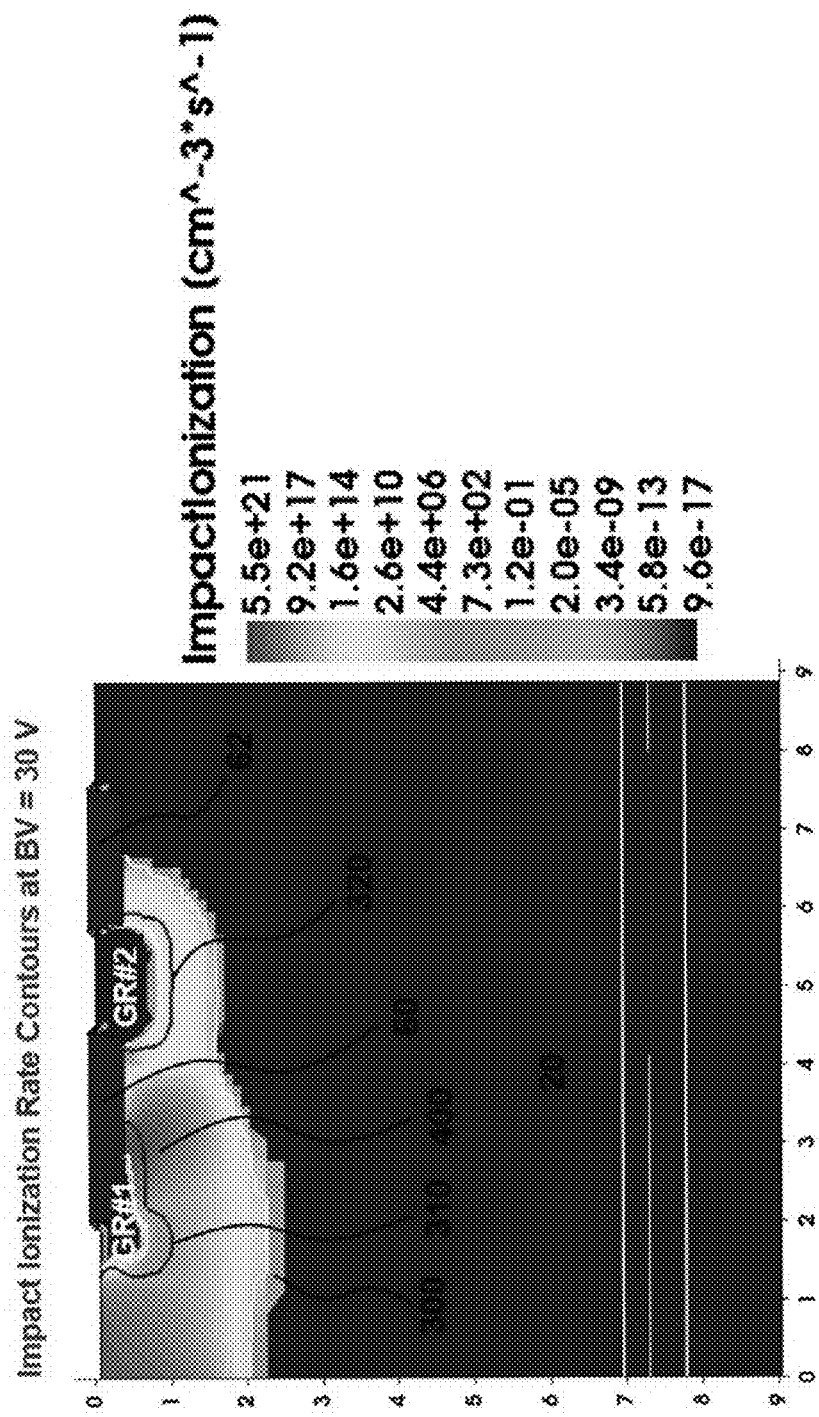
FIG. 4A to FIG. 4C are impact ionization rate contours at the breakdown voltage BV=30 V, showing the reverse and the forward electrical characteristics of the Schottky diode with a long STI1 or X=1.38 μm of the present examples.

FIG. 4A is an impact ionization rate contour plot for STI1 or X=1.38 μm. For example, high impact ionization rate contours are located at the area 400. A large quantity of electron-hole pairs is generated in the high electric filed area 400. The high impact ionization rates determine the avalanche breakdown voltage of the Schottky diode. As the impact ionization rate gets higher, the breakdown voltage becomes lower. If the first guard ring 30 GR#1, including a P-type well, is arranged at the corner of the element isolation layer, the local intensification of strong electric fields is relieved. If the only element isolation layer is formed between the anode and the cathode, strong electric fields appear at the bottom corner or the surface of the silicon material adjacent to the STI 60. However, if the first guard ring GR#1 30 having a P-type dopant is arranged in FIG. 4A, the strong electric field is not concentrated at the bottom corner or the surface of the silicon adjacent to the STI. The strong electric field or the high impact ionization rate contour moves to the PN junction of the first guard ring and the deep N-well. As a result the uniformity of the electric field or the impact ionization rate contours improves. Therefore, the first guard ring leads to uniform electric field or impact ionization rate contours. As a result, the avalanche breakdown voltage improves.

Further, Breakdown Voltage (BV) improves due to the second guard ring 40 GR#2 present in a floating state in this example. That is, the depletion region 300 is further extended toward the cathode, due to the second guard ring 40 GR#2, which relieves a locally strong electric field and improves the uniformity of the electric field. Also, the element isolation layer 62 prevents the formation of a strong electric field of the P+-N+ junction of the floating guard ring 40 and the N+ and N-well region 50 as well as the enlargement of the layout size, due to a junction isolation between the regions 40 and 50. Hence, the Schottky diode of the present description shows an improved breakdown voltage due to the presence and form of first guard ring or a first junction 30 GR#1, the second guard ring or a second PN junction 40 GR#2, and the element isolation layer 62, as compared to the alternative Schottky diode presented in the example of FIG. 1.

Figure 4B:
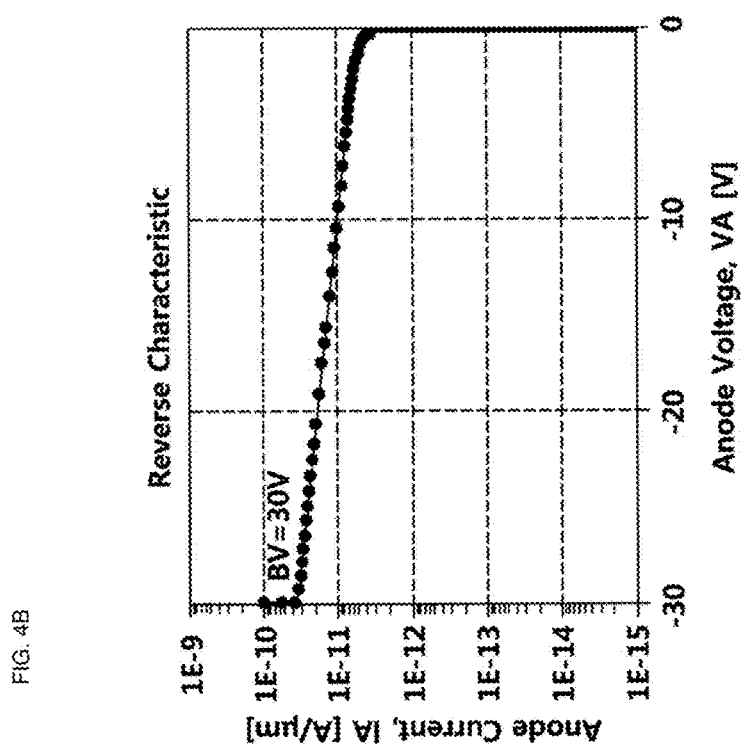

FIG. 4B illustrates Technology Computer-Aided Design (TCAD) simulation results of the reverse electrical characteristic and the breakdown voltage BV=30 V of the Schottky diode in the example of FIG. 2B for STI1 or X=1.38 μm. The simulated results are in excellent agreement with the measurement results for the Schottky diode area 3 μm*3 μm presented in FIG. 3B.

Figure 4C:
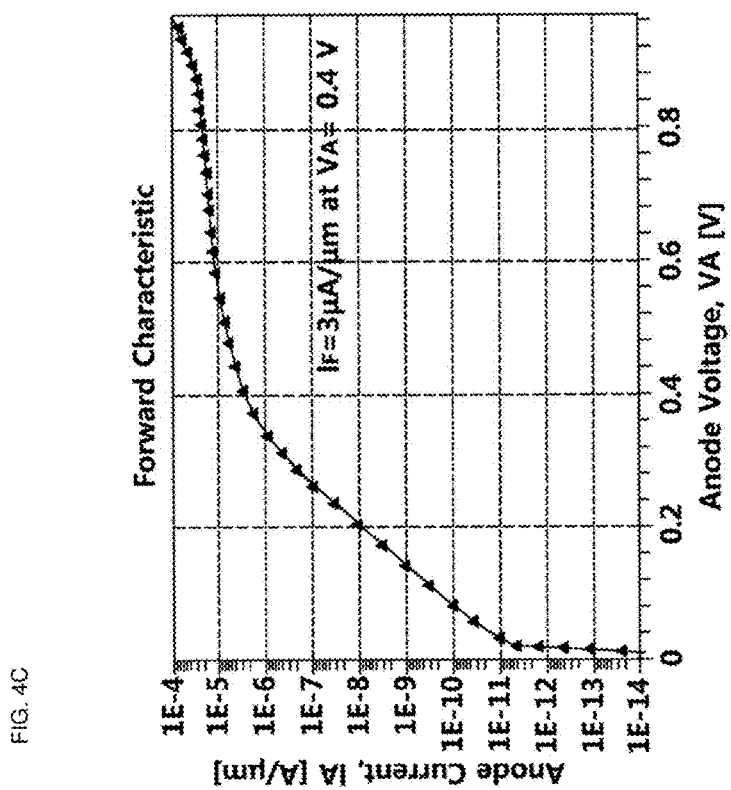

FIG. 4C shows TCAD simulation results of the forward electrical characteristic and the turn-on current at $V_A=0.4$ V of the Schottky diode in the example of FIG. 2B for STI1 or X=1.38 μm. The simulated results are in excellent agreement with the measurement results for the Schottky diode area 3 μm*3 μm presented in FIG. 3A.

The second guard ring 40 in a floating state is quite effective as a way to improve the breakdown voltage. The breakdown voltage is also potentially improved further by adjusting the separation distance, STI1, between the first guard ring 30 and the second guard ring 40 in FIG. 2B.

Figure 5A:
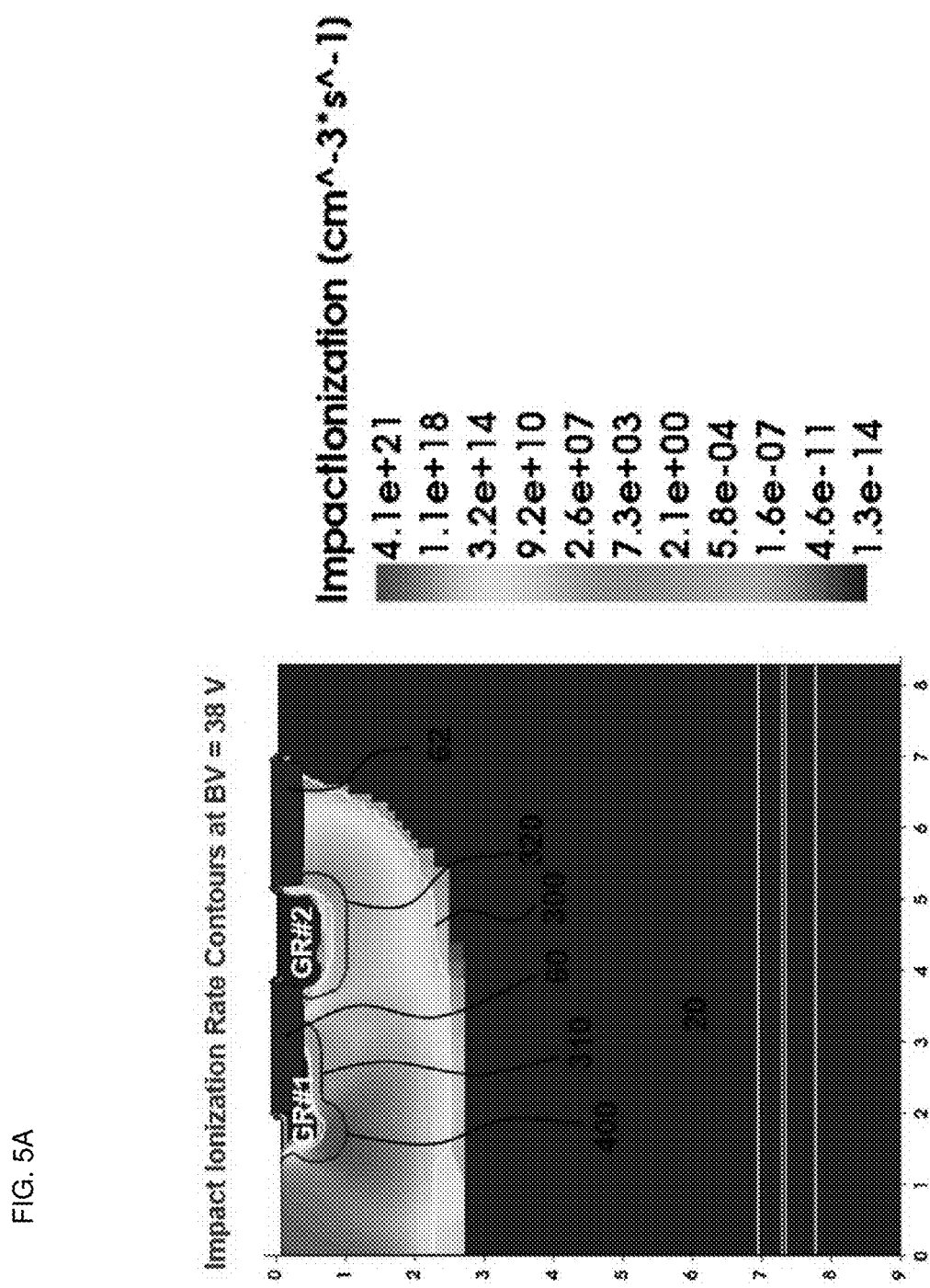
FIG. 5A to FIG. 5C are impact ionization rate contours at BV=38 V, showing the reverse and the forward electrical characteristics of the Schottky diode with a shorter STI1 or X=0.8 μm of the present examples.
Figure 5B:
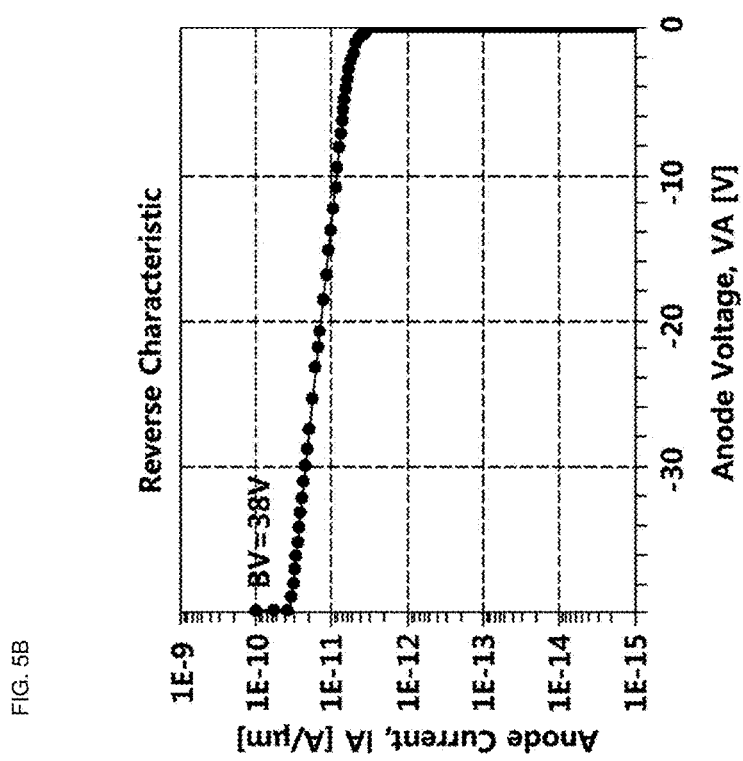
Figure 5C:
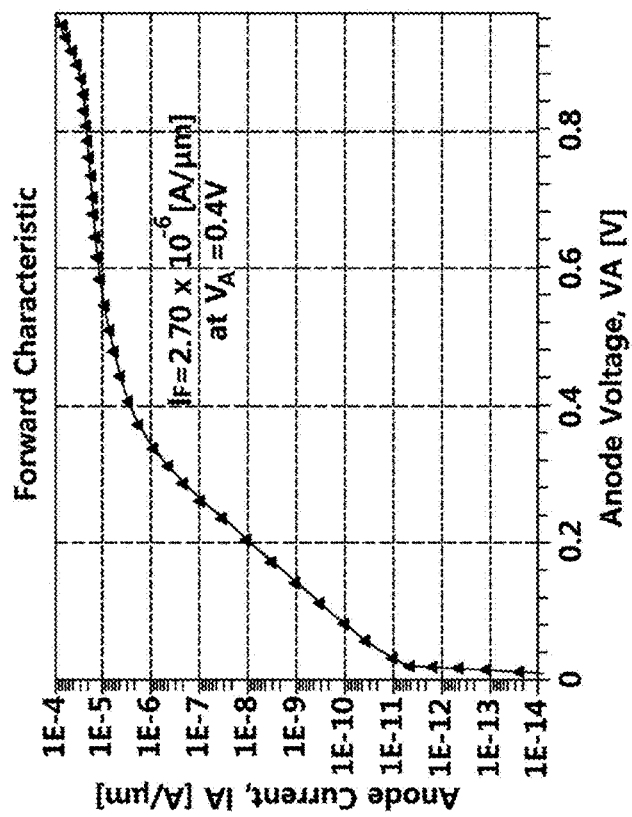

FIG. 5A, FIG. 5B and FIG. 5C show the impact ionization rate contours at the breakdown voltage BV=38 V, defining the reverse and the forward electrical characteristics, respectively, of the Schottky diode in FIG. 2B for STI1 or X=0.8 μm.

FIG. 5A illustrates an impact ionization rate contour plot of the Schottky diode in the example of FIG. 2B for STI1=0.8 μm. That is, a TOAD result of the first guard ring 30 GR#1 in a non-floating state and the second guard ring 40 GR#2 in a floating state becomes narrower than that of the Schottky diode in the FIG. 2B for STI1=1.38 μm. Thus, the depletion region edge 300 indicated as a dotted line is further extended down towards the substrate than the Schottky diode for STI1=1.38 μm. For example, the depth of the depletion region further increases to a level of 2.5 μm. Additionally, the dark part 400, that is, the high impact ionization rate area, is not located in the STI bottom surface but instead is farther away from the STI edge corner. Also, in such an example, the uniformity of the electric field or the impact ionization rate contours improves. In this example, the breakdown voltage BV increases to 38 V. White lines 310 and 320 refer to the PN junction boundaries of the first and the second guard rings, respectively. In this example, the boundaries of the PN junction do not contact each other. If the boundaries were to contact each other, the second guard ring would no longer be in a floating state.

FIG. 5B illustrates TOAD simulation results on the reverse electrical characteristic and the breakdown voltage BV=38 V of the Schottky diode in the example of FIG. 2B for STI1 or X=0.8 μm, where the Schottky diode area is 3 μm*3 μm. By narrowing the separation distance between the first guard ring 30 and the second guard ring 40, the breakdown voltage BV increases from 30V to 38V.

FIG. 5C illustrates TOAD simulation results on the forward electrical characteristic and the turn-on current at $V_A=0.4$ V of the Schottky diode in the example of FIG. 2B for STI1 or X=0.8 μm, where the Schottky diode area is 3 μm*3 μm. In this example, the degradation of the turn-on current of the Schottky diode for STI1=0.8 μm compared to the Schottky diode for STI1=1.38 μm is negligible.

Also, the width of STI1 has an effect on a breakdown voltage of a Schottky diode with a floating guard ring.

The breakdown voltage increases as the first guard ring 30 and the second guard ring 40 become closer at the bottom surface of the first element isolation layer 60. However, the first guard ring 30 and the second guard ring 40 are not to contact each other. If the first guard ring 30 and the second guard ring 40 were to come into contact, the floating effect of the second guard ring 40 would disappear.

Figure 6A:
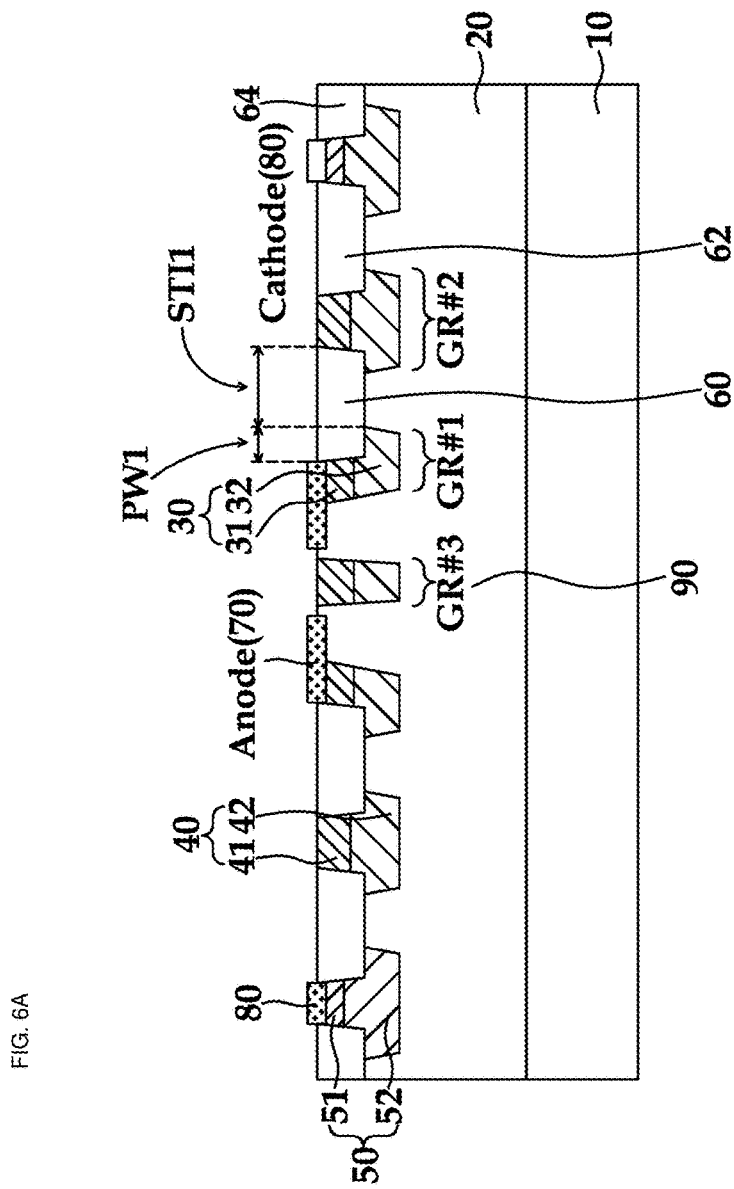
FIG. 6A to FIG. 6B are Schottky diodes having two floating guard rings according to an example.
Figure 6B:
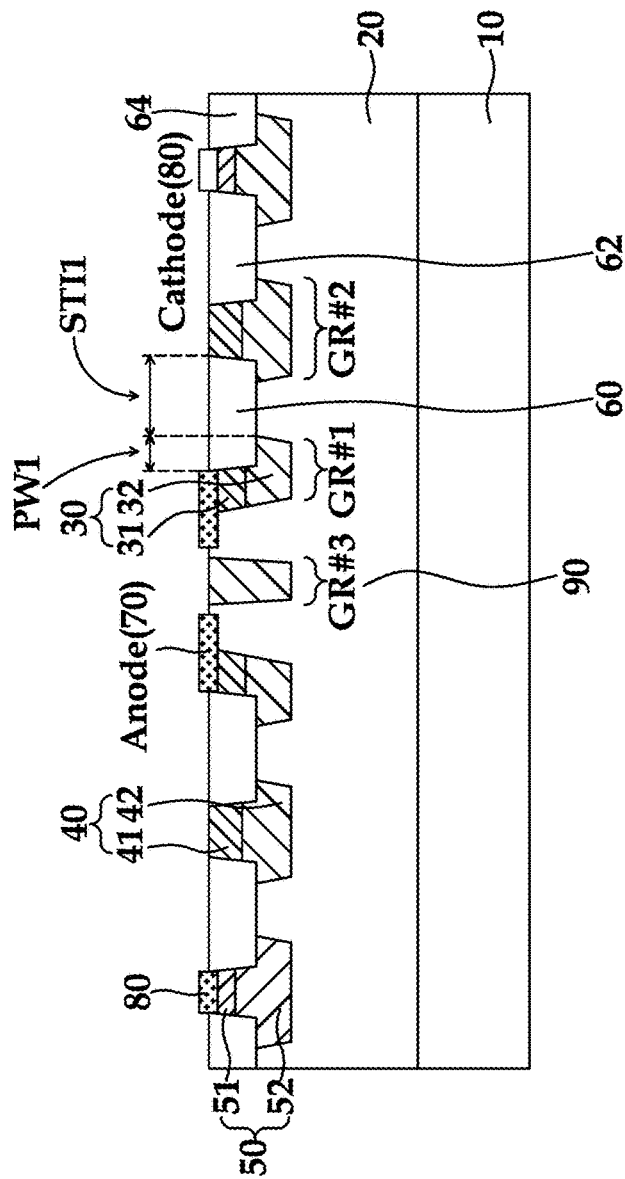

FIG. 6A to FIG. 6B illustrate Schottky diodes having a floating guard ring according to an example. FIG. 6A and FIG. 6B potentially illustrate various examples and these examples are presently discussed further.

As illustrated in the example of FIG. 6A, the Schottky diode having a floating guard ring according to an example also optionally includes at least one guard ring in a central region of the deep well region, unlike the example of FIG. 2B. Such a guard ring is referred to as a third guard ring 90 for easier explanation.

Herein, at least one third guard ring 90 GR#3 is formed in an inner region of the first guard ring 30. In this example, the third guard ring 90 is not electrically connected with an anode electrode 70 and the second guard ring 40 is formed in a floating state.

The third guard ring 90 includes two regions as illustrated in the example of FIG. 6A or one region that is doped with a predetermined impurity concentration as illustrated in the example FIG. 6B. Furthermore, as illustrated in the example of FIG. 6A, the third guard ring 90 potentially includes a first region 91 formed having a P+ type high impurity concentration so as to contact the upper surface of the substrate, and a second region 92 formed having a P-type lower impurity concentration than the impurity concentration of the first region 91 and formed to surround the lower region of the first region 91. Furthermore, as illustrated in FIG. 6B, the third guard ring 90 is potentially formed with one P-type doping region 90 having an impurity concentration falling within a predetermined range.

Referring to the examples of FIG. 6A and FIG. 6B, the third guard ring 90 is configured to have a depth that is the same as that of the first guard ring 30 and that of the second guard ring 40. Furthermore, in an example, the depth of the third guard ring 30 is determined according to a target value of a Schottky diode having floating guard rings.

When adding at least one third guard ring 90 in a central region of deep well of a Schottky diode having floating guard rings according to an example, not only the breakdown voltage is efficiently improved but an acceptable and/or improved turn-on current is also obtained.

Thus, in examples, at least three PN junctions 30, 40 and 90 are configured in Deep NW 20. That is, the first PN junction 30 is formed by the first guard ring 30, the second PN junction 40 is formed by the second guard ring and the third PN junction 90 is formed by the third guard ring. Also, the depletion region 300 shown in FIG. 7A further increases in a reverse bias state by the PN junctions 30, 40, 90. Thus, by using this approach, the uniformity of the electric fields and the impact ionization rate contours improve further. Accordingly, in this example, the breakdown voltage BV increases to 43 V. The use of the third guard ring 90 leads to the high breakdown voltage. The reason why this property occurs is explained further with respect to FIGS. 7A, 7B and 7C.

Figure 7A:
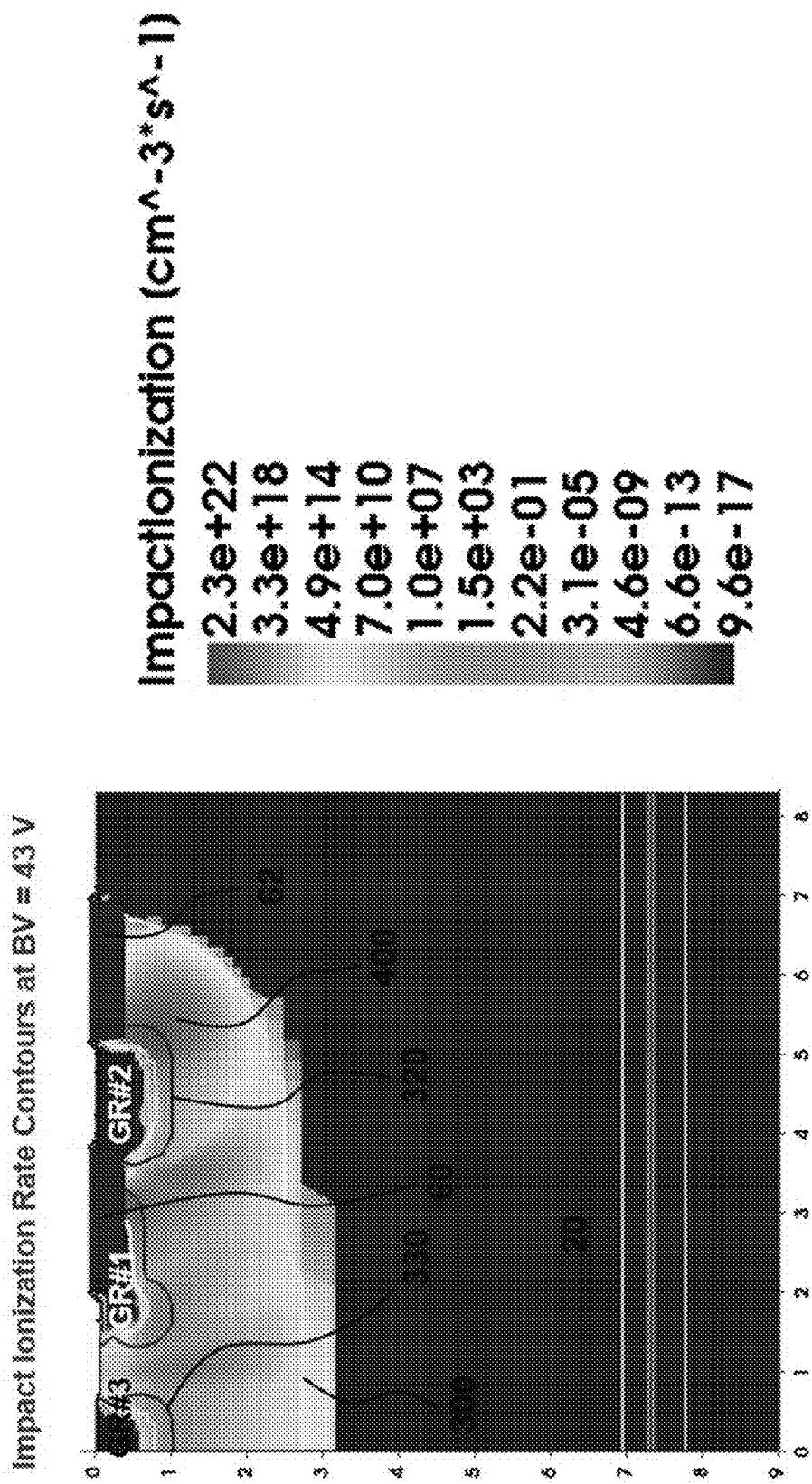
FIG. 7A to FIG. 7C are the impact ionization rate contours at BV=43 V, showing the reverse and the forward electrical characteristics of the Schottky diode of the present examples when a third guard ring is added.
Figure 7B:
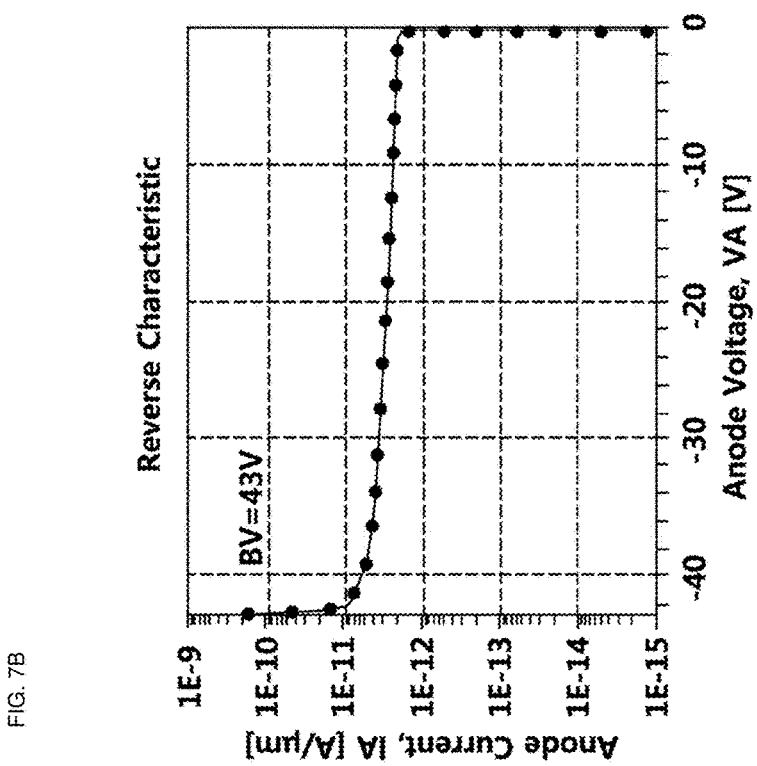
Figure 7C:
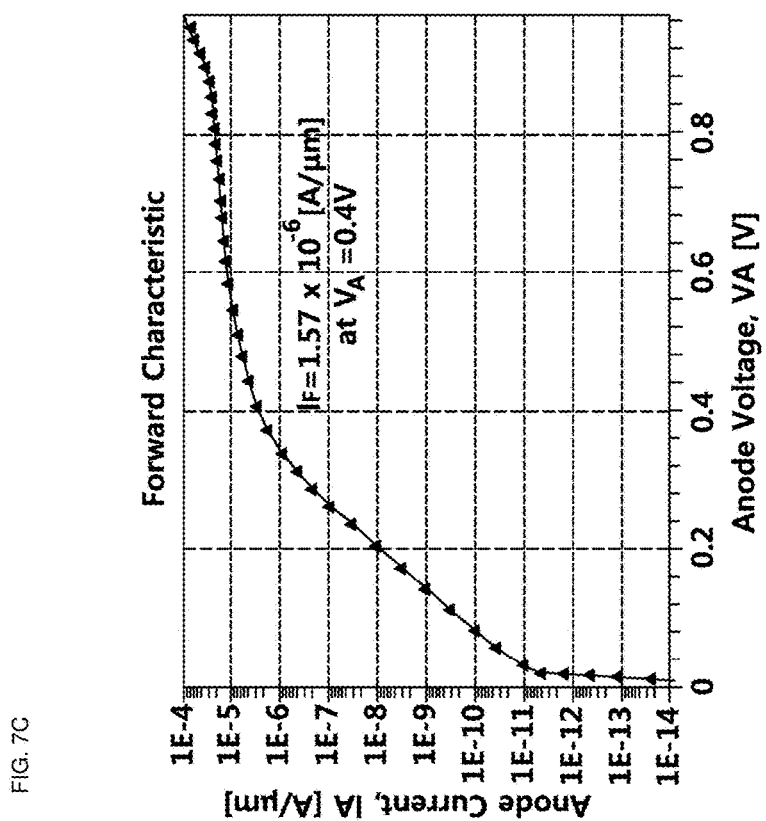

FIG. 7A to FIG. 7C are the impact ionization rate contour plot, the reverse and the forward electrical characteristics, respectively, of a Schottky diode of the present examples when a third guard ring 90 is added.

FIG. 7A is an impact ionization rate contour corresponding to an example in which the third guard ring 90 is added. The impact ionization rate contour presented in FIG. 7A is a result that occurs when the width or depth PW1 of the overlap between the first guard ring 30 and the element isolation layer 60 has the value of 0.6-1.6 μm. Also, the depletion region 300 is further extended down towards the substrate when adding the first guard ring 30 GR#1 in a non-floating state, a second guard ring 40 in a floating state GR#2 and a third guard ring 90 in a floating state GR#3. That is, in this example, the depth and area of the depletion region 300 are further increased. Furthermore, a dark part 400 has the highest impact ionization rate, such that the area is not in the bottom surface of the first STI element isolation layer 60 but is moved to the right lower second guard ring 40 GR#2. The dark part 400 is located in a bottom surface of the second STI element isolation layer 62. This location is chosen to be far from the STI edge corner. The further the dark part 400 is from the second STI element isolation layer 62, the more the breakdown voltage BV increases. By contrast, white lines 310, 320, 330 indicate PN junction boundaries. In this example, the boundary lines 310, 320, 330 of the PN junction regions of the first guard ring, the second guard ring and the third guard ring are not in contact with each other. If the boundary lines 310, 320, 330 were to be in contact with each other, the second guard ring and the third guard ring would no longer be in a floating state.

FIG. 7B illustrates the reverse characteristic of the Schottky diode in the example of FIG. 6A for STI1=0.8 μm. The anode current rapidly increases at the breakdown voltage −43V. By narrowing the space and adding the third floating guard ring, the breakdown voltage BV substantially increases from 30V to 43V.

FIG. 7C illustrates the forward characteristics of the Schottky diode in the example of FIG. 6A for STI1=0.8 μm. The anode voltage value is a forward anode current IF=1.57 μA/μm at 0.4V that indicates reaching the aimed value. There is no degradation of the IF value, although the first guard ring, the second guard ring and the third guard ring exist.

When a P+ region is formed on a P-type well in the third guard ring structure, all such examples show similar breakdown voltage BV and IF values, not shown. That is, breakdown voltage BV and IF values are independent of P+. As a result, normal operation is possible even though there is no P+ region and only the P-type well.

Figure 8A:
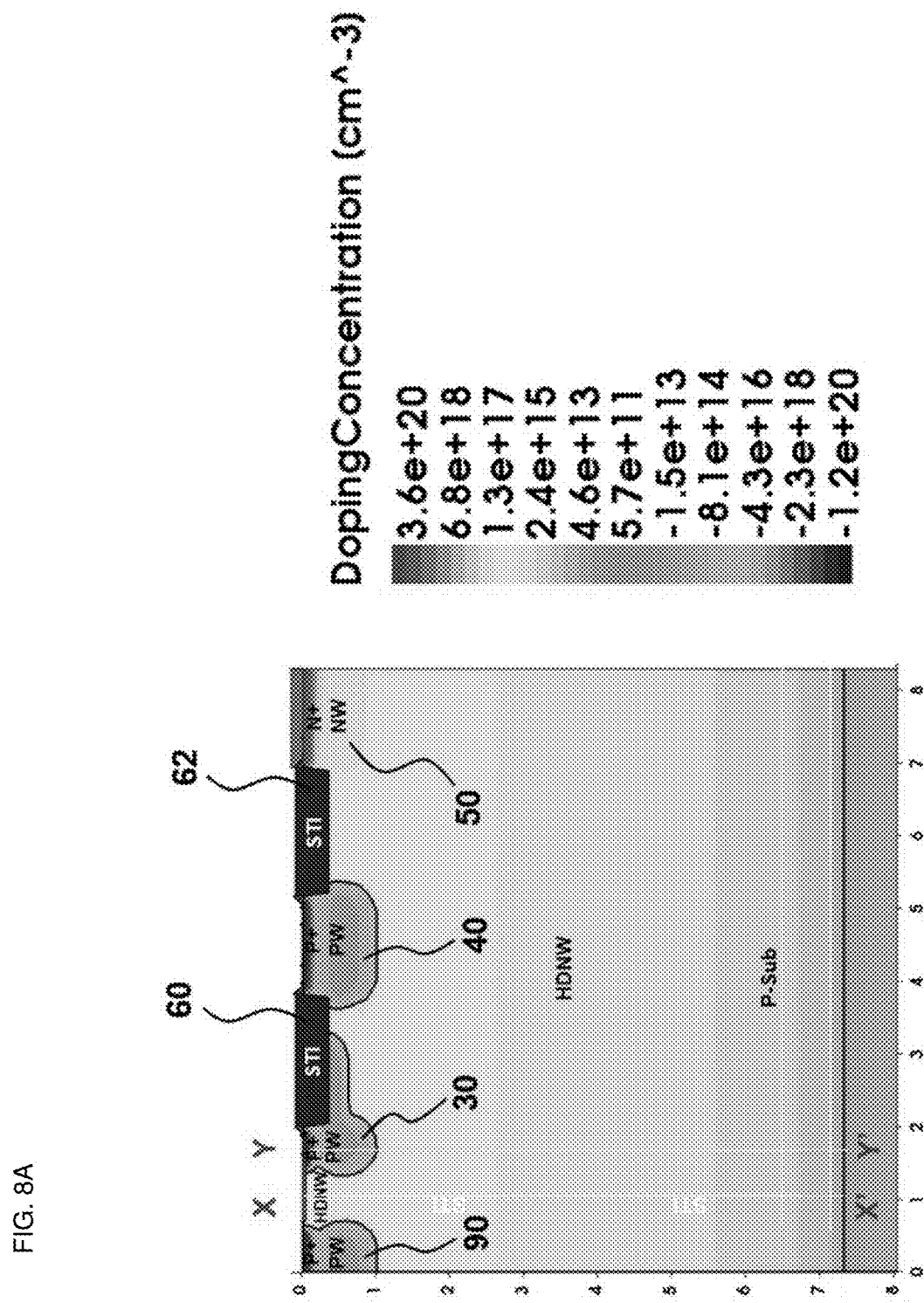
FIG. 8A to 8C are the 2D net doping contours, and the net doping profiles in the first guard ring and the surrounding region, high-voltage deep N-Well (HDNW), of the Schottky diode in FIG. 6A of the present examples.
Figure 8B:
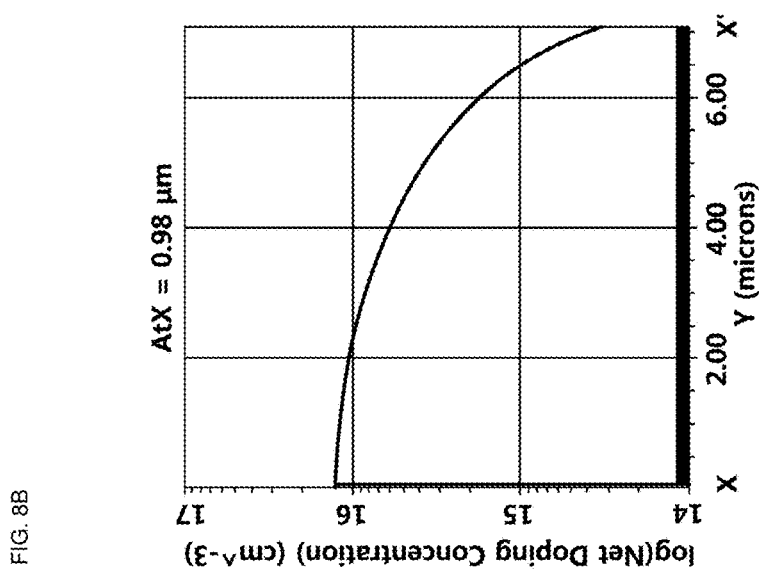
Figure 8C:
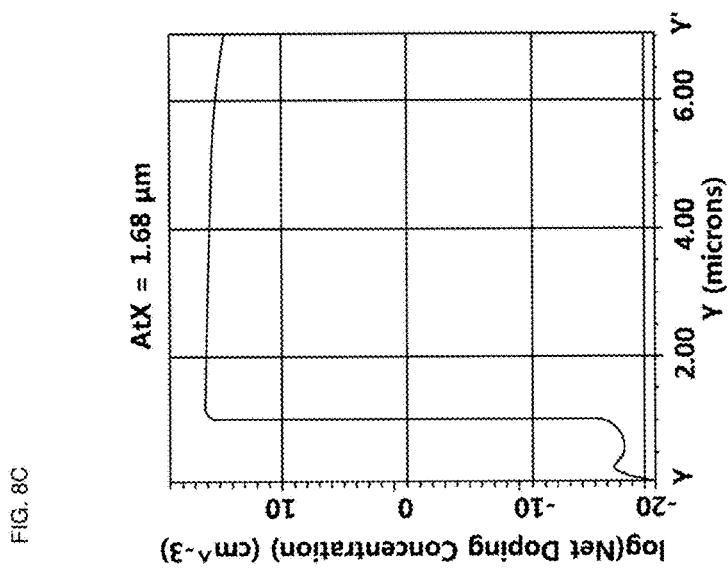

FIGS. 8A, 8B, and 8C illustrate TOAD simulation results on net doping concentration profiles of the first guard ring 30 and the surrounding region of the present examples.

FIG. 8A illustrates a net doping concentration contour of a Schottky diode having a floating structure with the third guard ring 90 added. Referring to FIG. 8A, X-X' is a vertically cut surface of an N-type deep well 20 formed between the first guard ring 30 and the third guard ring 90 to observe a concentration profile of the N-type deep well 20. By contrast, Y-Y' is a line directed from the first guard ring 30 to the n-type deep well 20 to observe the concentration profile of the first guard ring 30. The concentration profile of the second guard ring 40 is the same as the concentration profile of the first guard ring 30, and thus both concentration profiles are observed with one view.

FIG. 8B illustrates a concentration profile of an N-type deep well 20 corresponding to X-X'. The concentration of the N-type deep well 20 starts at approximately 1E16 cm$^{-3}$ and it is 2E14 cm$^{-3}$ at the boundary of N-type deep well 20 and P-substrate 10. Thus, the concentration drops over 1 order of magnitude in a parabolic shape. For example, a distance from the substrate surface to the P-substrate 10 is 7 μm.

FIG. 8C illustrates a concentration profile regarding a N-type deep well 20, the P+ region 31 and the P-type well PW 32 corresponding to Y-Y'. A concentration of the first guard ring 30 has a range of 1E16 to 1E20 cm$^{-3}$. The concentration of the second guard ring 40 has a range of 1E16 to 1E20 cm$^{-3}$. This concentration is the same as that of the first guard ring 30 because the concentration of the second guard ring 40 is formed using the same conditions as the first guard ring 30. Thus, a high breakdown voltage BV value is obtained within the range of 1E16 to 1E20 cm$^{-3}$.

Figure 9A:
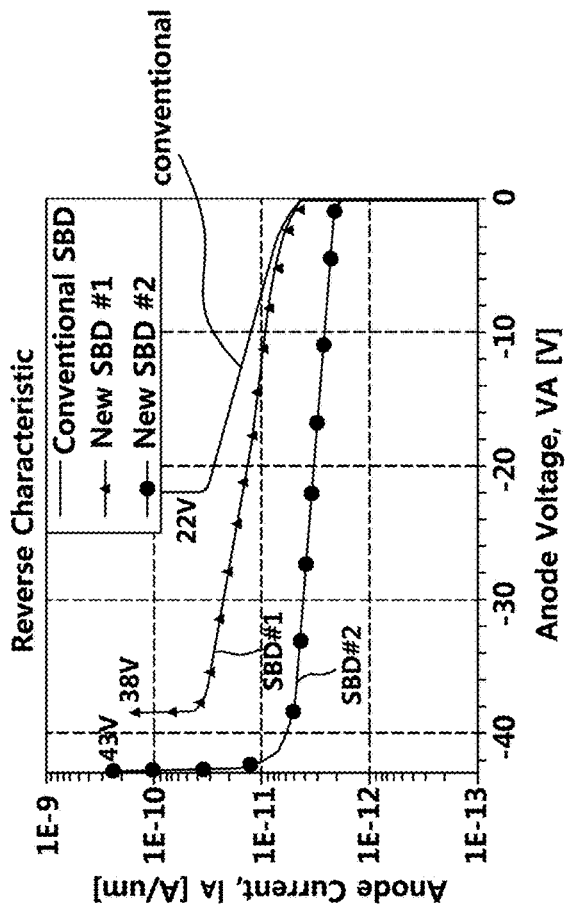
FIG. 9A to 9B are comparisons of electrical characteristics between the Schottky diodes of examples having floating guard rings and additional STI and the alternative Schottky diode. The Schottky diodes of examples have higher breakdown voltages than does the alternative Schottky diode, while maintaining the features of a low turn-on voltage and negligible degradation of turn-on current.
Figure 9B:
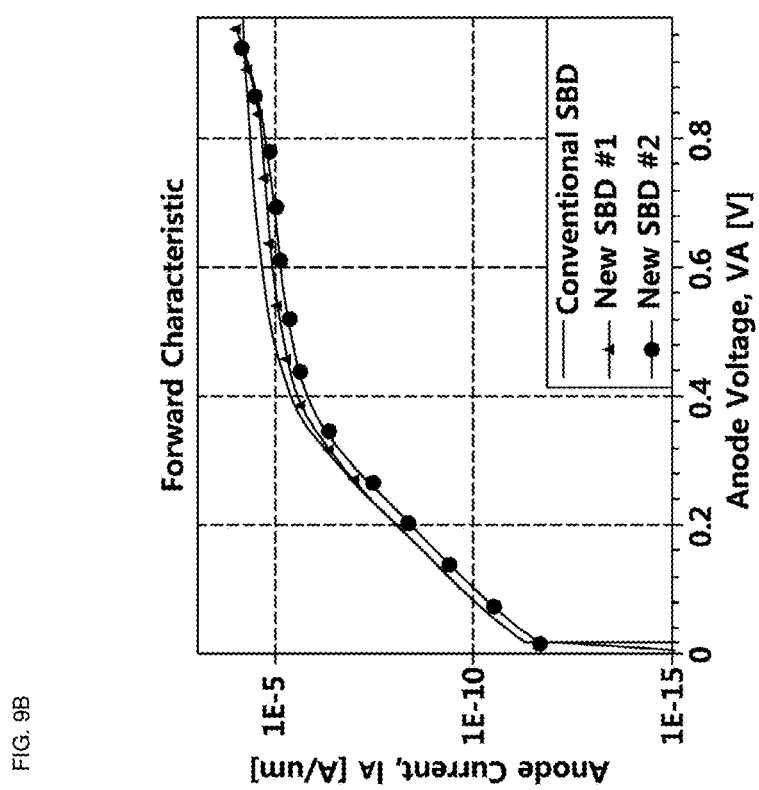

FIG. 9A and FIG. 9B illustrate a performance comparison result of the Schottky diodes that have a floating guard ring, compared with an alternative Schottky diode. First, as illustrated in FIG. 9A, a Schottky diode that has a floating structure of the present examples has a substantially increased breakdown voltage. Referring to an alternative Schottky diode, labeled as being a conventional Schottky diode, having the structure illustrated in FIG. 1, such a Schottky diode has a limit for its breakdown voltage of 22V. However, a Schottky diode having a floating guard ring of the present examples, labeled as New SBD #1 and New SBD #2, obtain breakdown voltages of 38 to 43V. Accordingly, the breakdown voltage of the Schottky diode of the present examples is achieved to be between 25-50V.

FIG. 9B illustrates an IF value when a forward bias is applied. In FIG. 9B, with reference to a conventional Schottky diode as discussed above, and the Schottky diodes having a floating guard ring according to the present examples have similar IF values. Hence, the Schottky diodes according to the present examples have satisfactory IF values.

Figure 10:
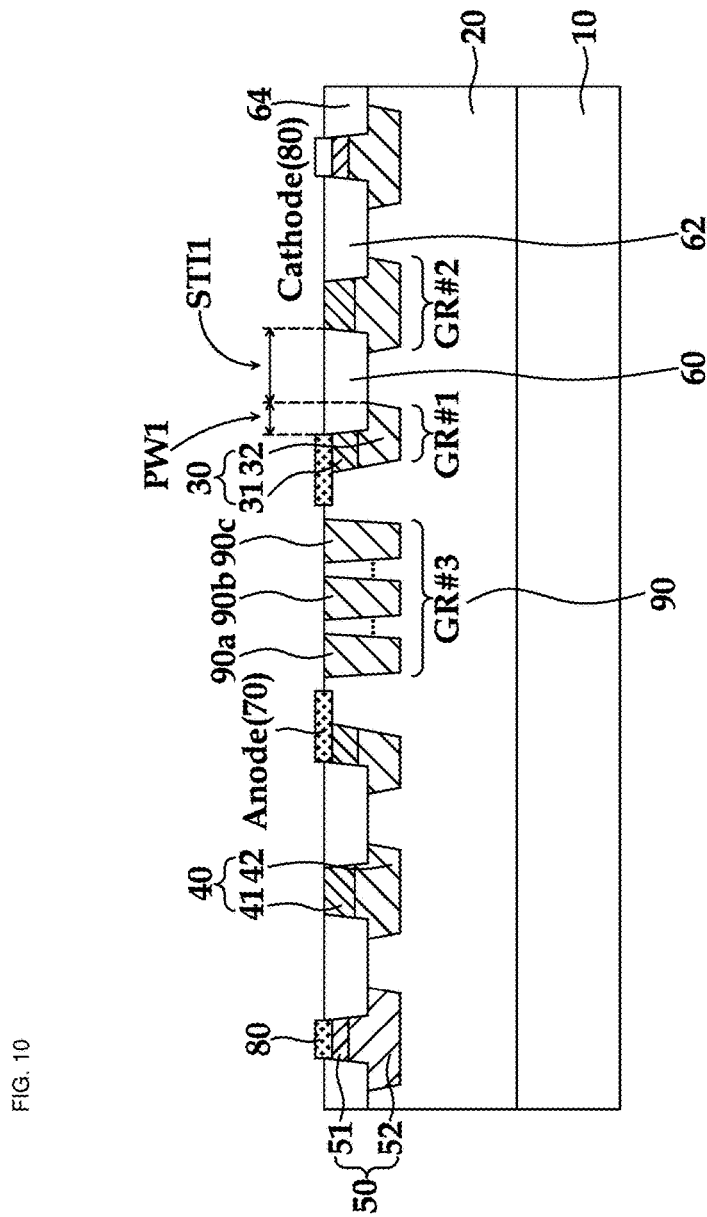
FIG. 10 is a cross-sectional view illustrating a Schottky diode having multiple floating guard rings according to an example. The breakdown voltage of the Schottky diode with the multiple floating guard rings is potentially higher than 43 V.

FIG. 10 is a cross-section illustrating a Schottky diode having a plurality of floating structures according to another example.

As illustrated in FIG. 10, a Schottky diode having multi-floating guard rings according to an example also additionally forms at least two guard rings 90A, 90B, 90C in a central region of a deep well region unlike the example FIG. 6A. Hereinafter, these guard rings are referred to as the third guard rings 90A, 90B, 90C for easier explanation. While FIG. 10 illustrates the use of three additional guard rings, any appropriate number of guard rings that is at least two is used in various examples. Herein, the third guard rings are in an electrically floating, open state. Higher breakdown voltages are obtained, as the number of the third guard rings increases in the central region that is in the periphery of an anode electrode.

To recapitulate and summarize the present examples, a Schottky diode having a floating guard ring includes an anode electrode 70 and a cathode electrode 80 formed on a substrate, a first PN junction 30 that is electrically connected with the anode electrode 70, a first well region 50 that is electrically connected with the cathode electrode 80, a second PN junction 40 formed between the anode electrode 70 and the cathode electrode 80, a first element isolation layer 60 formed between the first PN junction 30 and the second PN junction 40, a second element isolation layer 62 formed between the second PN junction 40 and the first well region 50, and the first PN junction and the second PN junction are formed to be in contact with the bottom surface of the first element isolation layer 60, where the second PN junction 40 is a floating region electrically.

Accordingly, the lengths of overlap of the first PN junction and the second PN junction with the first element isolation layer 60 potentially differ from one another. Furthermore, the length of overlap of the second PN junction with the first element isolation layer 60 is potentially 40-60% of the value of the entire depth of the first isolation layer. Further, the concentration of the second PN junction is 1E16 to 1E20 cm$^{-3}$. Accordingly, the high impact ionization rate area is potentially located to be far from the edge region of the first element isolation layer due to its location with respect to the first and second PN junctions.

A Schottky diode having a floating structure according to an example configures a guard ring with a floating potential in the region between the anode electrode and the cathode electrode, and thereby improves the breakdown voltage of a Schottky diode compared to that of a related Schottky diode.

In further detail, a Schottky diode having a floating structure according to an example potentially achieves a breakdown voltage of greater than approximately 35V through the described structure and examples.

Furthermore, there is an effect of maintaining a switching feature and functionality similar to the level of a related Schottky diode by maintaining a turn-on voltage like the related Schottky diode by improving a breakdown voltage by selecting the aforementioned structure.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A Schottky diode having a floating guard ring comprising:
    a deep well of a first conductivity type formed in a substrate;
    a first guard ring of a second conductivity type in a non-floating state formed to surround a center region of the deep well;
    a second guard ring of a second conductivity type in a floating state formed in an outer region of the first guard ring to surround the first guard ring;
    a first well region of a first conductivity type formed in an outer region of the second guard ring to surround the second guard ring;
    element isolation layers formed on the region between the first guard ring and the second guard ring, and the region between the second guard ring and the first well region;
    an anode electrode formed on the substrate and electrically connected to the deep well and the first guard ring;
    a cathode electrode formed on the substrate and electrically connected to the first well region; and
    an additional element isolation layer formed between the second guard ring and the cathode electrode.

2. The Schottky diode having a floating guard ring of claim 1,
    wherein the first and second guard rings are formed to be deeper than the element isolation layers.

3. The Schottky diode having a floating guard ring of claim 1,
    wherein the first and second guard rings are formed to contact parts of the deep well and bottom sides of the element isolation layers.

4. The Schottky diode having a floating guard ring of claim 1,
    wherein the first and second guard rings, respectively, comprise:
    a first doping region and a second doping region, and
    wherein the first and second doping regions have different impurity concentrations.

5. The Schottky diode having a floating guard ring of claim 4,
    wherein the first doping region has a high dopant concentration, and
    the second doping region has a low dopant concentration.

6. The Schottky diode having a floating guard ring of claim 1,
    wherein depths of the first and second guard rings are the same.

7. The Schottky diode having a floating guard ring of claim 1,
    wherein the anode electrode comprises anode electrodes that are connected to form the anode electrode,
    and the Schottky diode further comprises a third guard ring of a second conductivity type, in a floating state, formed between the anode electrodes.

8. The Schottky diode having a floating guard ring of claim 1,
    wherein the anode electrode comprises anode electrodes that are connected to form the anode electrode,
    the Schottky diode further comprises a third guard ring of a second conductivity type formed between the anode electrodes, and
    the anode electrode is not formed on an upper side of the third guard ring.

9. A Schottky diode having a floating guard ring comprising:
    an anode electrode and a cathode electrode formed on a substrate;
    a first PN junction that is electrically connected to the anode electrode;
    a first well region that is electrically connected to the cathode electrode through a well and a heavily doped region, the well and the heavily doped region having the same conductivity type;
    a second PN junction that is formed between the anode electrode and the cathode electrode; and
    a first element isolation layer that is formed between the first PN junction and second PN junction,
    wherein the first PN junction and second PN junction are formed to be in contact with a bottom side of the first element isolation layer, and
    the second PN junction is an electrically floating region.

10. The Schottky diode having a floating guard ring of claim 9,
    wherein lengths of overlap of the first PN junction and second PN junction with the first element isolation layer are different.

11. The Schottky diode having a floating guard ring of claim 9,
    wherein the second PN junction has an impurity concentration of 1E16 to 1E20 $cm^{-3}$.

12. The Schottky diode having a floating guard ring of claim 9,
    wherein the first PN junction has substantially the same depth as the second PN junction.

13. The Schottky diode having a floating guard ring of claim 9,
    wherein a breakdown voltage of the Schottky diode is 38 to 50V or higher.

14. A Schottky diode having a floating guard ring comprising:
    a first guard ring in a non-floating state formed to surround a center region of a deep well formed in a substrate;
    a second guard ring in a floating state formed in an outer region of the first guard ring to surround the first guard ring;

a first well region formed in an outer region of the second guard ring to surround the second guard ring;

element isolation layers formed on the region between the first guard ring and the second guard ring, and the region between the second guard ring and the first well region;

an anode electrode formed on the substrate and electrically connected with the deep well and the first guard ring; and a cathode electrode configured on the substrate and electrically connected to the first well region.

15. The Schottky diode having a floating guard ring of claim 14, further comprising an additional element isolation layer formed between cathode electrode and a well tap formed in the substrate.

16. The Schottky diode having a floating guard ring of claim 14, wherein the deep well and the first well region are of a first conductivity type and the first guard ring and the second guard ring are of a second conductivity type.

17. The Schottky diode having a floating guard ring of claim 14, wherein the first and second guard rings are formed to be deeper than the element isolation layers.

18. The Schottky diode having a floating guard ring of claim 14, wherein the first and second guard rings are formed to contact parts of the deep well and bottom sides of the element isolation layers.

19. The Schottky diode having a floating guard ring of claim 14, wherein the first and second guard rings, respectively, comprise a first doping region and a second doping region, and wherein the first and second doping regions have different impurity concentrations.

20. The Schottky diode having a floating guard ring of claim 14, wherein depths of the first and second guard rings are the same.

* * * * *